United States Patent [19]

Bhagwat

[11] Patent Number: 4,945,467
[45] Date of Patent: Jul. 31, 1990

[54] MULTIPLE-MODE VOLTAGE CONVERTER
[75] Inventor: Pradeep M. Bhagwat, Baltimore, Md.
[73] Assignee: Black & Decker Inc., Newark, Del.
[21] Appl. No.: 161,122
[22] Filed: Feb. 26, 1988
[51] Int. Cl.$^5$ .................................. H02M 7/5387
[52] U.S. Cl. .................................. 363/132; 363/17; 363/98; 363/134
[58] Field of Search ............... 363/16, 17, 24, 25, 363/98, 131, 132, 134

[56] References Cited

U.S. PATENT DOCUMENTS

| | | | |
|---|---|---|---|
| 3,257,604 | 6/1966 | Colclaser et al. | 363/132 |
| 3,315,144 | 4/1967 | Poss | 363/96 |
| 3,596,165 | 7/1971 | Andrews | 363/16 |
| 3,925,633 | 12/1975 | Partridge | 219/10.49 |
| 4,017,784 | 4/1977 | Simmons et al. | 363/17 |
| 4,055,790 | 10/1977 | Gerding et al. | 363/24 |
| 4,092,711 | 5/1978 | Gerding et al. | 363/53 |
| 4,122,514 | 10/1978 | Amin | 363/17 |
| 4,126,819 | 11/1978 | Stobbe et al. | 363/56 |
| 4,167,776 | 9/1979 | Nygaard | 363/56 |
| 4,178,628 | 12/1979 | Shepard | 363/25 |
| 4,196,469 | 4/1980 | Gurwicz | 363/131 |
| 4,201,957 | 5/1980 | Cathell | 363/132 |
| 4,227,243 | 10/1980 | Gurwicz et al. | 363/132 |
| 4,310,866 | 1/1982 | Wirth | 363/132 |
| 4,316,243 | 2/1982 | Archer | 363/132 |
| 4,333,134 | 6/1982 | Gurwicz | 363/17 |
| 4,347,558 | 8/1982 | Kalinsky | 363/17 |
| 4,353,112 | 10/1982 | Rietveld et al. | 363/16 |
| 4,383,293 | 5/1983 | Randall | 363/25 |
| 4,404,623 | 9/1983 | Jourdan | 363/17 |
| 4,408,270 | 10/1983 | Anderson et al. | 363/132 |
| 4,429,359 | 1/1984 | Anderson | 363/132 |
| 4,449,175 | 5/1984 | Ishii et al. | 363/17 |
| 4,455,545 | 6/1984 | Shelly | 336/200 |
| 4,464,709 | 8/1984 | Barter | 363/16 |
| 4,485,434 | 11/1984 | Beeston et al. | 363/132 |
| 4,491,892 | 1/1985 | Lehmann et al. | 361/101 |
| 4,533,986 | 8/1985 | Jones | 363/17 |
| 4,535,399 | 8/1985 | Szepesi | 363/134 |
| 4,550,359 | 10/1985 | West | 361/56 |
| 4,555,608 | 11/1985 | Mizukawa et al. | 219/10.77 |
| 4,558,407 | 12/1985 | Sterner | 363/132 |
| 4,564,800 | 1/1986 | Jurjans | 363/17 |
| 4,564,897 | 1/1986 | Okamoto et al. | 363/132 |
| 4,586,118 | 4/1986 | Mihalka | 363/17 |
| 4,594,650 | 6/1986 | Kinbara | 363/58 |
| 4,602,209 | 7/1986 | Williams et al. | 323/351 |
| 4,631,653 | 12/1986 | Small | 363/98 |
| 4,692,851 | 9/1987 | Attwood | 363/16 |
| 4,719,559 | 11/1988 | Sokal et al. | 363/132 |

FOREIGN PATENT DOCUMENTS

| | | |
|---|---|---|
| 3305224 | 8/1984 | Fed. Rep. of Germany . |
| 2353991 | 3/1977 | France . |
| 1393637 | 5/1975 | United Kingdom . |
| 1524722 | 9/1978 | United Kingdom . |
| 2086672 | 5/1982 | United Kingdom . |

OTHER PUBLICATIONS

INTELEC '87 Conference Proceedings—Jun. 14, 1987, Stockholm, pp. 204-210; Yutaka Kuwata et al.
APEC '87 Conference Proceedings—Mar. 2, 1987, San Diego, Calif., pp. 221-229; R. L. Steigerwald et al.
Power Semiconductor Circuits by S. B. Dewan and A. Straughen, Copyright 1975 by John Wiley & Sons, Inc., Chapter Seven (Inverters), pp. 357-373.

*Primary Examiner*—Patrick R. Salce
*Assistant Examiner*—Jeffrey Sterrett
*Attorney, Agent, or Firm*—J. Bruce Hoofnagle; Harold Weinstein; Edward D. Murphy

[57] ABSTRACT

A voltage converter (100) converts a high voltage, low frequency input to a low D.C. voltage output. The input is rectified to facilitate the operation of an oscillator (202) which operates alternately a pair of MOSFETS (124 and 126).

Upon operation of MOSFET (124), the intermediate D.C. voltage is applied across and directs current in one direction through a primary winding (132) of a high frequency step-down transformer (134) and also charges a series-connected capacitor (152). Upon operation of MOSFET (126), capacitor (152) discharges to provide current through primary winding (132) in the opposite direction. In this manner, an alternating voltage at a high frequency is stepped down to a secondary winding (142) of transformer (134) and is rectified to provide the low D.C. voltage output.

Diodes (120 and 122) prevent undesirable oscillations within voltage converter (100) if a short should occur in any load connected to the output of the converter.

45 Claims, 9 Drawing Sheets

MULTIPLE-MODE VOLTAGE CONVERTER

FIELD OF THE INVENTION

This invention relates to a voltage converter and particularly relates to a high frequency converter for converting either a high A.C. voltage signal or a high level D.C. voltage to a low level D.C. voltage.

BACKGROUND OF THE INVENTION

Many different types of electrical devices are powered by low voltage systems. Such devices include, but are not limited to, household and kitchen products, power tools, outdoor lawn and garden equipment, lighting systems, camping accessories, automotive products and a variety of battery chargers. Many of these devices are operated in areas where conventional A.C. sources, or high level D.C. sources, are available. In such instances, it would be advantageous to use the available power sources to operate the devices. Consequently, facility must be provided for converting the available power source to a source and level compatible with the power operating level of the device to be used.

In the past, many systems and techniques have been employed to accomplish the necessary conversion. A basic technique used in the past to convert conventional high A.C. voltage to low D.C. voltage included the use of a step-down transformer and a rectifier. However, such conventional A.C. sources typically operate at low frequencies which necessitates the use of a bulky transformer of substantial weight and size. In this instance, the physical parameters of the transformer prohibit feasible maneuverability of any system which includes the bulky transformer and the device being powered. Therefore, the versatility of any system utilizing the bulky transformer is extremely limited.

Another converter system has employed a technique whereby the initial power source, either A.C. or D.C., is converted to a high frequency signal by use of a pair of alternately switched transistors. Voltage reduction is then accomplished by a high frequency transformer. The transformer output is then rectified to obtain the low level D.C. voltage for operation of a low voltage device.

One example of such a circuit has a series leg which includes an inductor, a series capacitor and the primary of a high frequency transformer. One end of the series leg is connected between a pair of alternating switches such as transistors with parallel-connected diodes. The other end of the series leg is connected between a pair of split capacitors. The other ends of the split capacitors and the other ends of the switches are connected across a full wave rectifier.

This type of circuit requires the split capacitors which function as supply sources on alternate halves of the circuit operation and may require a filter capacitor. With this type of circuit, it is difficult to directly sense information which could be determined by the voltage parameter of the series capacitor. Further, it is not possible to sense directly the transformer current. Therefore, current sensing would have to be accomplished by some other indirect means such as, for example, a current transformer.

Examples of circuits using systems similar to the split capacitor system are illustrated in U.S. Pat. Nos. 4,196,469; 4,227,243 and 4,333,134.

In another type of system, such as that disclosed as prior art (FIG. 1) in U.S. Pat. No. 4,353,112, the high frequency principle is employed and includes an oscillatory circuit with an inductor and a capacitor. The inductor is connected to the primary of a high frequency transformer or it could be a leakage inductance of the high frequency transformer. Oscillations developed by the oscillatory circuit control a switching means to connect a D.C. supply to the inductor which receives and stores energy from the supply. During the oscillatory operation of such systems, power may be coupled to a load circuit only during a portion of the total cycle time which results in using either a separate inductor or a transformer with substantial leakage inductance and a complex control circuit such as described in U.S. Pat. No. 4,353,112. In this system, the topology can't be used on a transformer with a very low leakage inductance because transient imbalance in transformer volt-seconds can permanently saturate the transformer and has to be recovered by complex control means. When the transformer goes into permanent saturation without recovery, the switching transistors see excessive currents which could cause a catastrophic failure unless complex control means are used.

Also, there are many other systems which involve the complex principle of operation as noted above. Such systems include an oscillatory circuit which depends on a complex circuit design utilizing many reactive components, transistors, integrated circuit chips, diodes and resistive components. While the basis for high frequency operation permits the use of a lightweight transformer, the number of discrete components and chips employed in the complex circuit design lessen significantly any space advantage gained by use of the lightweight transformer.

Consequently, the space requirement for the many components, chips and transformer limits the adaptability of these prior systems for use as a power source in conjunction with devices where space and power requirements are critical factors. Therefore, there remains a need for a voltage converter of simple design which requires relatively little space but provides the necessary and efficient power during total cycle time of converter operation to operate powered devices.

Such a converter would enhance the versatility and portability of the powered devices by occupying a very limited space while not adding significantly to the bulk and weight of the combination of the powered device and converter.

SUMMARY OF THE INVENTION

This invention contemplates a basic voltage converter which includes a load circuit, means for coupling a power source to the converter to provide a primary D.C. power source and further includes a secondary D.C. power source. Primary coupling means couples the primary D.C. power source to the load circuit to apply power of one polarity to the load circuit during a first portion of each cycle of operation of the converter. Secondary coupling means couples the secondary D.C. power source to the load circuit to apply power of opposite polarity to the load circuit during a second portion of each cycle of operation of the converter.

In addition to the basic voltage converter, the invention further contemplates a third D.C. power source and means for coupling the third D.C. power source to the secondary coupling means during the second portion of each cycle to bias the secondary coupling means and thereby facilitate the application of power of the opposite polarity to the load circuit.

Also, in addition to the basic converter, the invention contemplates the secondary D.C. power source providing voltage at a prescribed level and the basic converter further includes means responsive to the voltage of the secondary D.C. power source rising to a predetermined level above the prescribed level for disabling the primary coupling means and secondary coupling means to preclude the application of voltage to the load circuit.

Further, in addition to the basic converter, the invention contemplates means responsive to current in the load circuit which is at a level above a prescribed level for shunting such current away from and to preclude any damage to the primary coupling means and the secondary coupling means.

This invention further contemplates a power buffer which includes first and second voltage sources and a chargeable voltage storage device. Means are provided for applying the cumulative voltage of the first and second voltage sources to the device to thereby charge the device to a prescribed voltage level. Means also are provided for applying the voltage of the first source to the load during a first period to supply current through the load in a first direction. Further, the power buffer includes means responsive to the application thereto of the voltage of the storage device for applying the voltage of the second source to the load to supply current through the load in a second direction.

DESCRIPTION OF THE PREFERRED EMBODIMENTS

Figure 5:
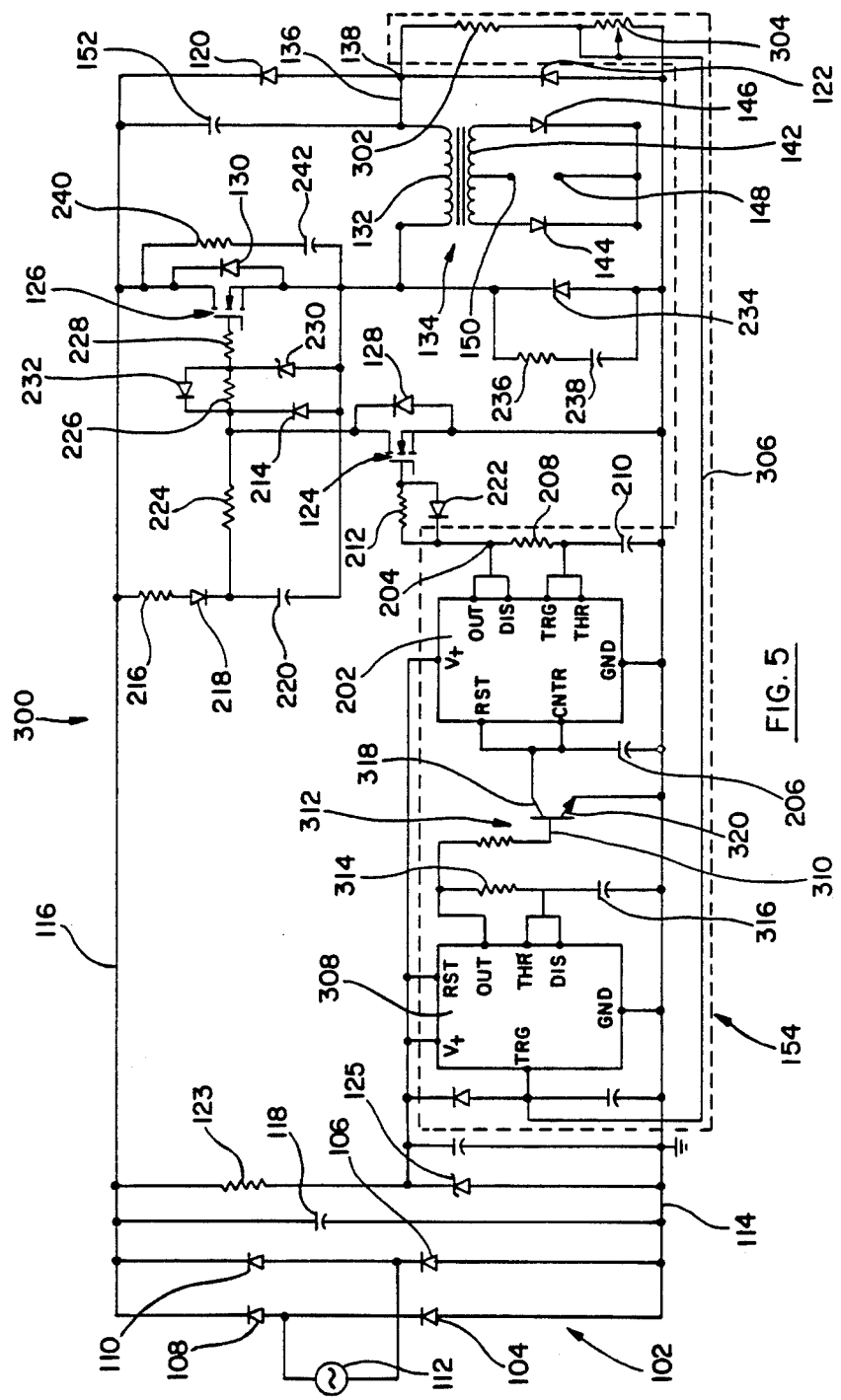
Figure 6:
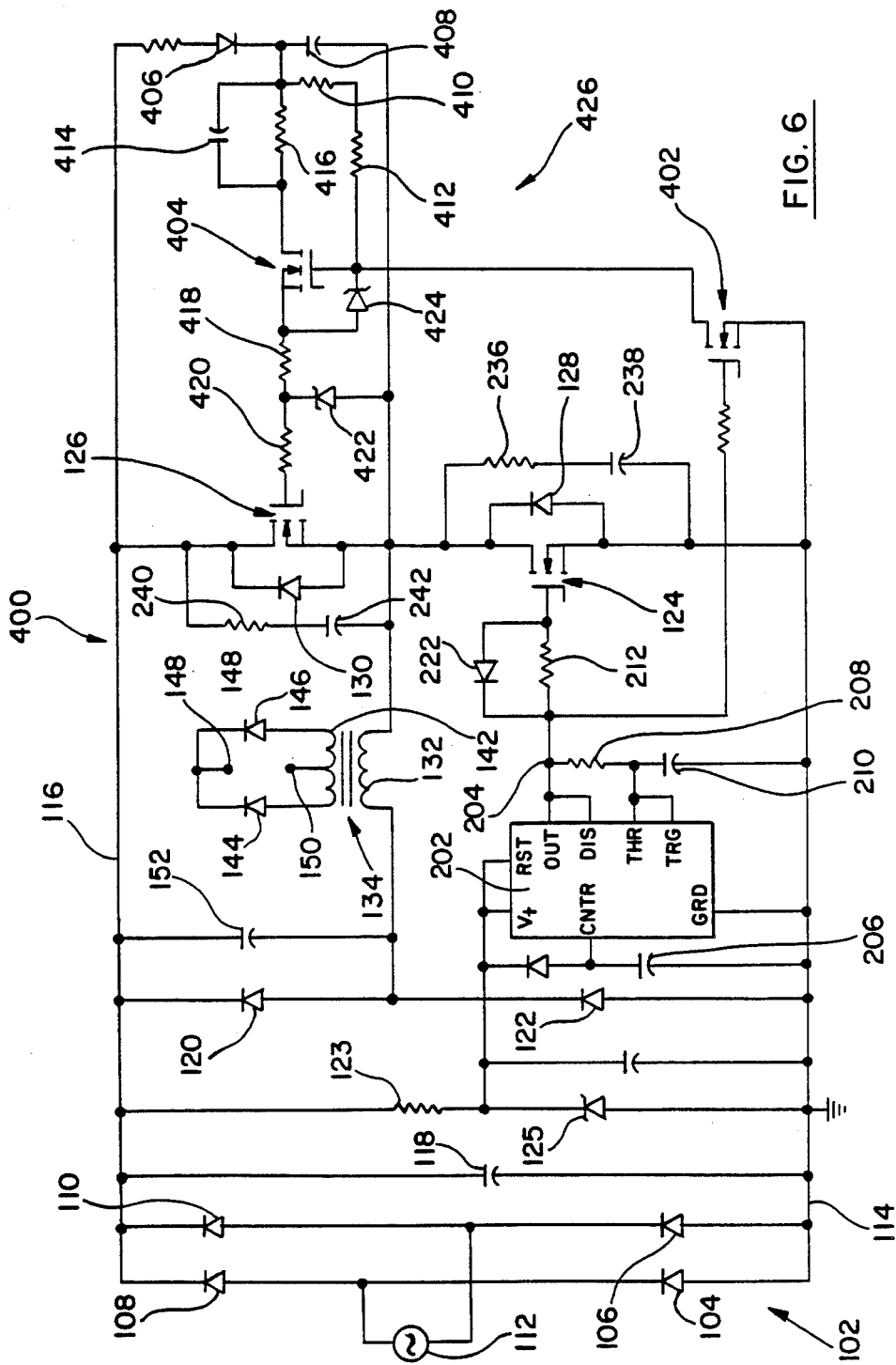
Figure 7A:
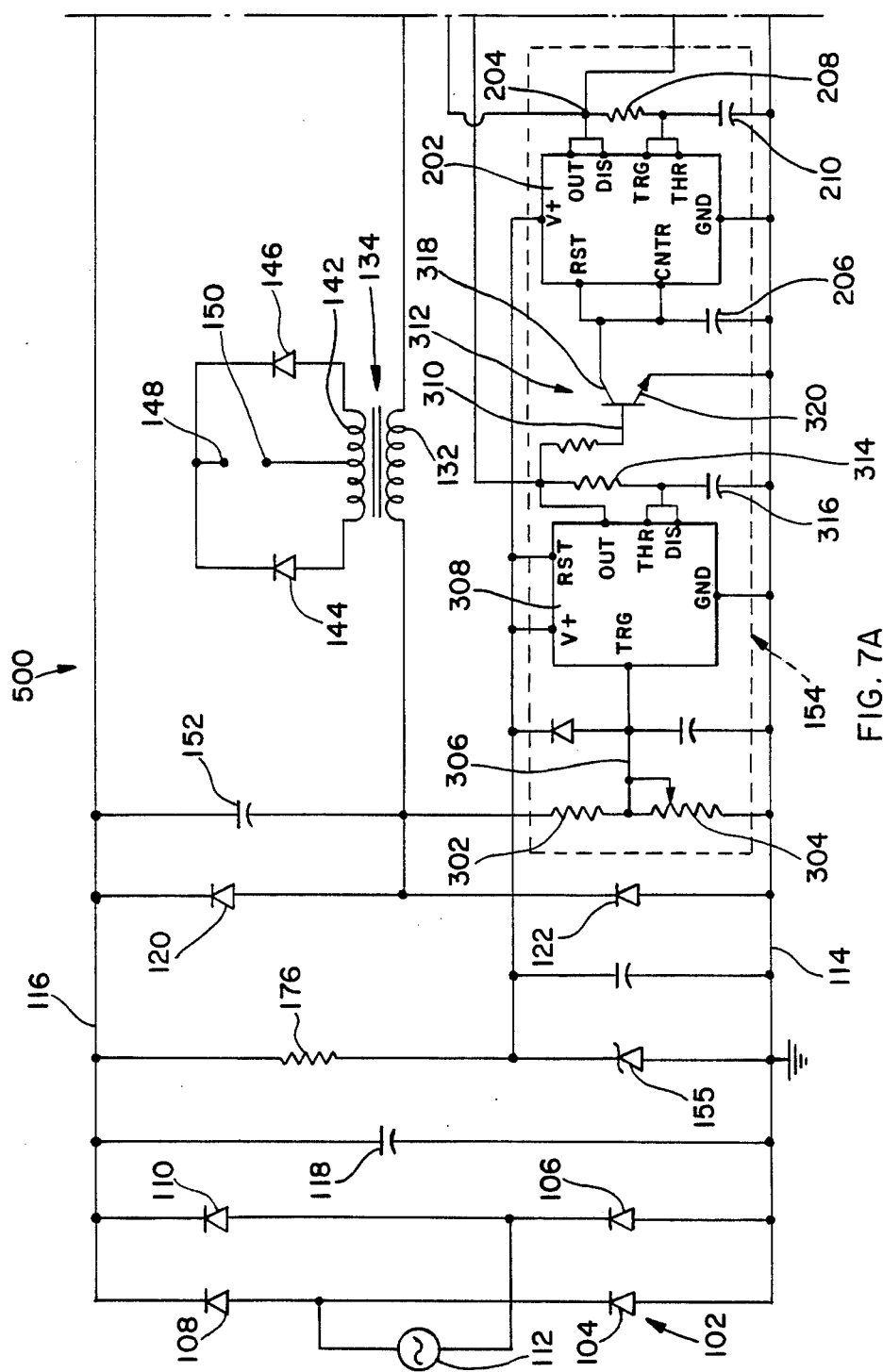
Figure 7B:
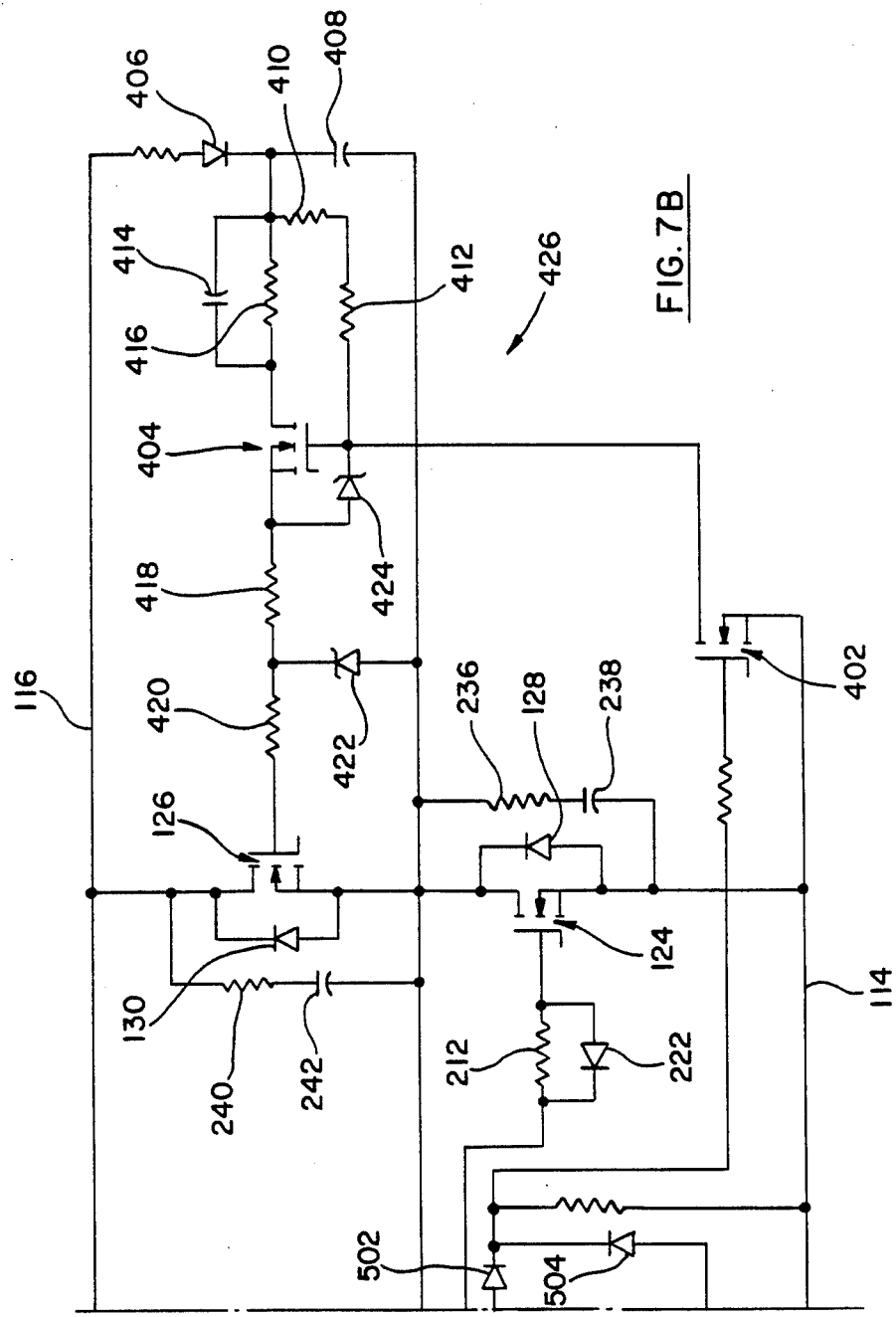

Referring to FIGS. 1, 3, 4, 5, 6 and collectively to FIGS. 7A and 7B, there are illustrated six voltage converters 100, 200, 250, 300, 400 and 500, respectively. Substantial portions of the converter topology of each of power converters 100, 200, 250, 300, 400 and 500 are common to one or more of the other converters. Therefore, in those instances where an element or component is first introduced in one figure and also appears in subsequent figures, the element or component will retain in the subsequent figures the number assigned thereto in the first figure.

Figure 1:
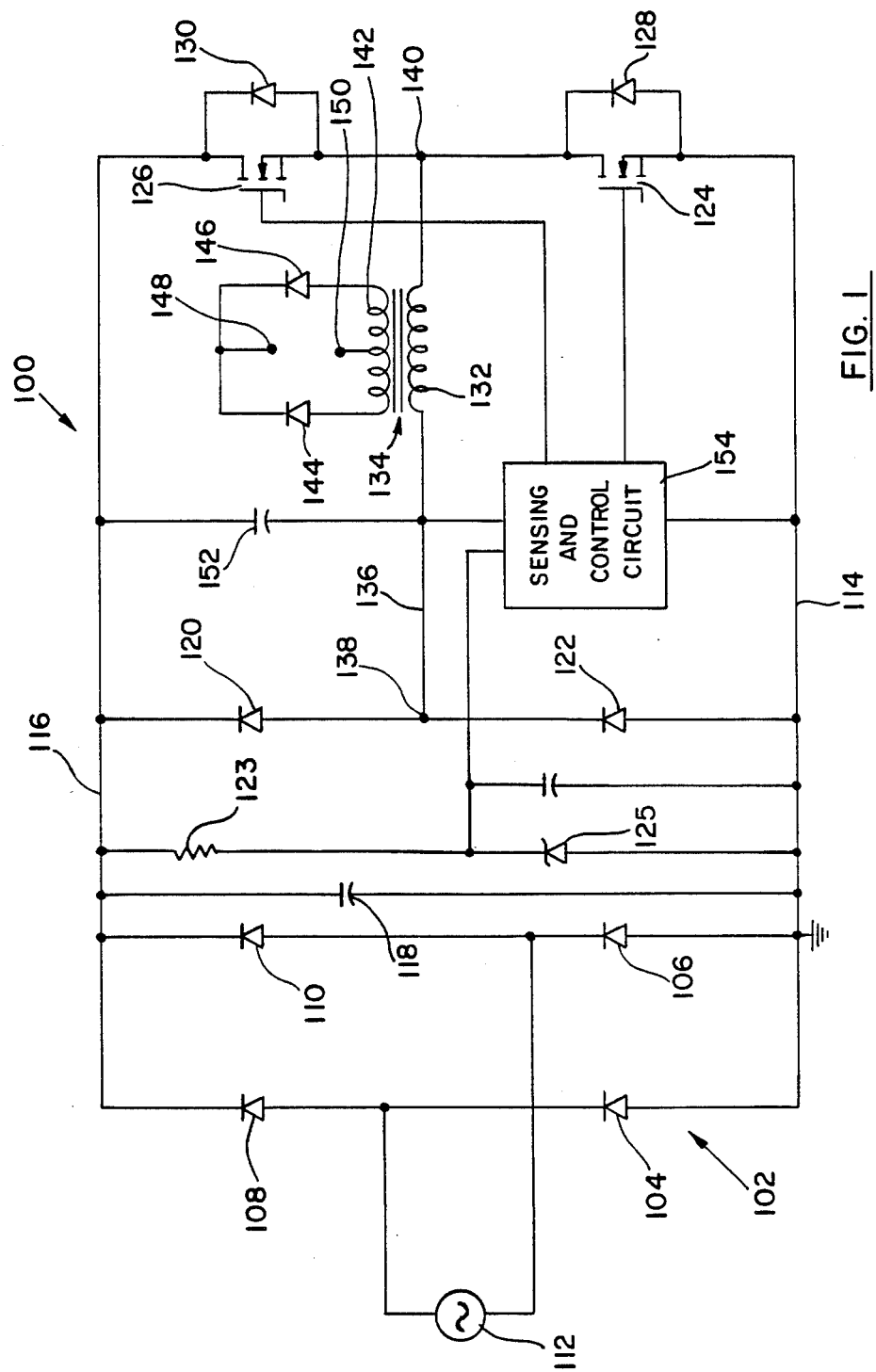
FIG. 1 is a simplified schematic of a voltage converter for converting high A.C. voltage, or high level D.C. voltage, to a low level D.C. voltage in accordance with certain principles of the invention.

Referring to FIG. 1, voltage converter 100, is designed to convert either a high A.C. voltage, or a high level D.C. voltage, to a low level D.C. voltage. While more detailed schematic representations of the various preferred embodiments of the invention are illustrated in FIGS. 3, 4, 5, 6, 7A and 7B and will be described hereinafter, the schematic of FIG. 1 represents a circuit diagram embodying the basic principles of the invention.

It is to be understood that parameters of the components of voltage converter 100 can be designed selectively to convert the voltage levels of a variety of A.C. and D.C. sources to desired D.C. voltage levels. For example, with selected circuit parameters and connections, voltage converter 100 can convert an A.C. input of 120 volts, 60 Hz, to any low level D.C. voltage such as, for example, a 12 volts D.C. output. Similarly, with only a change in circuit parameters, voltage converter 100 can convert an A.C. input of 220 volts, 50 Hz, to any low level D.C. voltage output. These are but a few representative examples of the A.C. to D.C. conversion capabilities of voltage converter 100. In addition, voltage converter 100 can convert a high level D.C. voltage to a low level D.C. voltage, for example, 150 volts D.C. to 12 volts D.C.

As illustrated in FIG. 1, voltage converter 100 includes a bridge rectifier 102 formed by diodes 104, 106, 108 and 110. An A.C. source 112, which supplies, for example, 120 volts at 60 Hz., is connected to rectifier 102. A.C. source 112 functions as a primary power source for voltage converter 100. The output of rectifier 102 is applied between ground reference line 114 and line 116. The rectified output is filtered by capacitor 118 to thereby provide 150 volts D.C. between lines 114 and 116.

A pair of oscillation damping diodes 120 and 122 are connected in series between lines 114 and 116. A voltage dropping resistor 123 and a voltage-establishing Zener diode 125 also are connected in series between lines 114 and 116.

The source and drain electrodes of a pair of N-channel power MOSFET transistors 124 and 126 are connected in series between lines 114 and 116 in the manner illustrated in FIG. 1. Intrinsic diodes 128 and 130 are representative of diode structure inherently formed as an integral and physical part of transistors 124 and 126, respectively, and are connected in parallel with the source and drain electrodes of the transistors. One side of a primary winding 132 of a high frequency, step-down transformer 134 is connected through a line 136 to a juncture 138 between diodes 120 and 122. The other side of primary winding 132 is connected to a node 140 between the drain electrode of transistor 124 and the source electrode of transistor 126.

The outside terminals of a center-tapped secondary winding 142 of transformer 134 are connected to the anodes of rectifier diodes 144 and 146. The cathodes of diodes 144 and 146 are each connected to a first output terminal 148 of voltage converter 100 while the center tap of secondary winding 142 is connected to a second output terminal 150.

It is noted that a load circuit could be formed solely by a single component such as, for example, primary winding 132 or could also include secondary winding 142, rectifiers 144 and 146 and output terminals 148 and 150. Thus, any load to be connected to any embodiment of voltage converter described herein, such as voltage converter 100, could be connected to the load circuit.

A capacitor 152 is connected between lines 114 and 136 in parallel with diode 120. A sensing and control circuit, designated generally by the numeral 154, also is connected between lines 114 and 136 and has outputs which are connected to the gate electrodes of transistors 124 and 126.

Sensing and control circuit 154 includes facility for monitoring the voltage appearing across capacitor 152 and also includes a high frequency oscillator. The high frequency oscillator of circuit 154 functions to facilitate the alternating operation of transistors 124 and 126 during normal operation of voltage converter 100, while other portions of circuit 154 functions to facilitate the complete and simultaneous shutdown of both transistors if undesirable conditions occur such as, for example, an overload.

When A.C. voltage is applied to voltage converter 100, a D.C. voltage of 150 volts D.C. is developed between lines 114 and 116. A D.C. voltage is developed thereby across Zener diode 125 which is applied to and facilitates operation of sensing and control circuit 154 which produces an alternating voltage in the form of a square wave at a frequency of, for example, 25 KHz whereby transistors 124 and 126 are alternately operated.

During one-half cycle of each square wave of the alternating voltage output of circuit 154, transistor 124 is biased on and current flows through capacitor 152, through primary winding 132, through the source and drain electrodes of transistor 124 and over line 114. During this half cycle of each square wave, the filtered output of rectifier 102 functions as a primary power source for transformer 134 whereby, as current flows in the first or charging direction through primary winding 132, a voltage is induced in secondary winding 142. If a load is connected to output terminals 148 and 150, current flows in the secondary winding 142, through one of the diodes 144 or 146, through any load connected to the output terminals and to the center tap of the secondary winding. Also, during this half cycle of operation, when current flows in the first or charging direction, capacitor 152 charges to a specific voltage level.

During the next half cycle of each square wave output of circuit 154, transistor 124 is turned off and transistor 126 is turned on. In this mode, primary winding 132 is now connected in a closed series loop which includes the source and drain electrodes of transistor 126 and capacitor 152. At this time, capacitor 152 begins to discharge, thereby supplying current in the closed series loop. This current flows in a second or discharging direction through primary winding 132 which is in a direction opposite to that when transistor 124 was conducting. In this mode, then, capacitor 152 functions as a secondary power source for transformer 134 whereby a voltage is induced in secondary winding 142. Again, assuming that a load is connected to output terminals 148 and 150, this results in current flow through the other of diodes 144 and 146, through any load connected to output terminals 148 and 150 and returns through the center tap of transformer 134.

Thus, during alternate operation of transistors 124 and 126, and during successive half-cycles of the square wave output of the oscillator of sensing and control circuit 154, current flows alternately in opposite directions through primary winding 132 at a relatively high frequency determined solely by the frequency of the oscillator of the sensing and control circuit.

As noted above, 150 volts D.C. appears between lines 114 and 116. During the conduction of transistor 124, the voltage between lines 114 and 116 is effectively split between primary winding 132 and capacitor 152 whereby the capacitor charges, theoretically, to a level of 75 volts. The remaining 75 volts is applied across primary winding 132 which is then stepped down in value by the split secondary winding 142. The secondary winding voltage is further rectified by diodes 144 and 146 to provide a low level D.C. voltage, for example, 12 volts, which is applied to output terminals 148 and 150 and, thereby, to any load connected thereto.

During the mode when transistor 126 is conducting, capacitor 152 is the power source for transformer 134. Since capacitor 152 has been charged to a level of 75 volts during the previous half cycle of the square wave output of circuit 154, this level of voltage effectively is applied to primary winding 132 and is the same voltage level applied to the primary winding during the previous half cycle.

Thus, the same level of voltage, but of opposite polarity, is applied to primary winding 132 during alternate half cycles of the square wave output of the oscillator of circuit 154. In this manner, a high frequency signal is applied to primary winding 132 which is stepped down by transformer 134 and rectified to provide the desired low level D.C. voltage at output terminals 148 and 150.

While the foregoing description illustrates the theoretical operation of voltage converter 100, there are practical aspects of the operation of the converter which must be considered. For example, the nature of the load, or no load, connected to output terminals 148 and 150 will have an effect on the operation of voltage converter 100. Also, it is the inherent nature of an inductor, such as primary winding 132, to maintain current flowing therethrough after the removal of external power. This is a result of the stored energy in the magnetic field which had been developed about primary winding 132 when the external power was applied previously to the primary winding.

When transistor 124 is on, current is flowing in the first or charging direction through primary winding 132 which is in a direction to charge capacitor 152. When transistor 124 is turned off and transistor 126 is turned on, capacitor 152 is in a mode to attempt to discharge as noted above. However, because of the stored energy of primary winding 132, current will continue to flow in the first direction through the primary winding which continues to charge capacitor 152 even though transistor 126 is now in a conducting mode. To accommodate this continued flow of current in the charging direction, intrinsic diode 130 is polarized to permit such current to bypass transistor 126 which is now on and biased for current conduction in the opposite or discharging direction. Due to the continued current flow in the charging direction, capacitor 152 charges to a level slightly above 75 volts. After the stored energy about primary winding 132 has fully dissipated, capacitor 152 begins to discharge as described above and current flows in the second or discharging direction through primary winding 132.

Under a no-load condition, transformer 134 presents a relatively large inductance, and thereby a larger impedance, in the circuit with capacitor 152. Thus, capacitor 152 will discharge very slowly.

Eventually, transistor 126 is turned off and transistor 124 is turned on. Theoretically, current should again flow in the first or charging direction from primary winding 132 to capacitor 152. However, again, due to the stored energy about primary winding 132, current continues to flow in the second or discharging direction from capacitor 152 to primary winding 132 whereby the capacitor continues to discharge at the slow rate due to the large inductance presented by transformer 134 during a no-load condition. In this mode, current flows through intrinsic diode 128 even though transistor 124 is turned on and biased to conduct current in the opposite or charging direction. Also, since capacitor 152 continues to discharge, the voltage across the capacitor continues to drop to a level slightly below 75 volts. After the stored energy of the field of primary winding 132 has dissipated completely, current flow now reverses to flow in the first direction from the primary winding to capacitor 152 to again charge the capacitor.

This cyclic pattern continues during a no-load condition where the capacitor voltage develops a low ripple or slight amplitude swing about the level of 75 volts.

Similar conditions exist when a normal or desired load is connected to output terminals 148 and 150. However, as described hereinafter, transformer 134 now presents a smaller inductance, and thereby less impedance, in the circuit of primary winding 132 than was presented during operation under a no-load condition.

Thus, during a normal-load mode, the voltage across capacitor 152 develops a somewhat greater ripple, or moderate amplitude swing, than during a no-load mode.

In an overload condition, such as a short in the load, the inductance and the impedance of primary winding 132 drops significantly resulting in wide amplitude swings in the voltage appearing across capacitor 152. Thus, the wide amplitude swing of the voltage of capacitor 152, resulting from the overload condition, produces a much greater ripple than the no-load or normal-load conditions and is, therefore, clearly distinguishable from the voltage swings of the no-load and normal-load conditions.

Sensing and control circuit 154 is designed to respond to wide swings in the voltage appearing across capacitor 152 and shut down the operation of both transistors 124 and 126. Thus, when an overload condition occurs, the voltage ripple of capacitor 152 increases significantly and beyond a predetermined level whereby transistors 124 and 126 are precluded from operating.

When voltage converter 100 is used as a voltage source to power motor or resistive loads, sensing and control circuit 154 constantly monitors and senses the voltage appearing across capacitor 152 and controls the operation of voltage converter 100 in response to the sensed capacitor voltage. Typically, capacitor 152 is valued at 0.5 to 2.2 microfarads when voltage converter 100 operates in this mode. Capacitor 152 thus becomes an information source in the sense that the voltage ripple of the capacitor is indicative of a variety of conditions that may occur in voltage converter 100 or in the load connected to output terminals 148 and 150 as noted above. The voltage of capacitor 152 is used to allow voltage converter 100 to operate at a fixed frequency significantly above the resonant frequency of the primary winding 132 and the capacitor. As the load which is connected between output terminals 148 and 150 increases, voltage converter 100 is allowed to operate in a semi-resonant mode. If the ripple of the voltage of capacitor 152 increases substantially as a result of an increased load or overload condition, transistors 124 and 126 are both turned off as soon as any portion of the ripple waveform of the capacitor exceeds the predetermined level established by the sensing and control circuit 154. Voltage converter 100 then ceases to provide an output between terminals 148 and 150.

Figure 2:
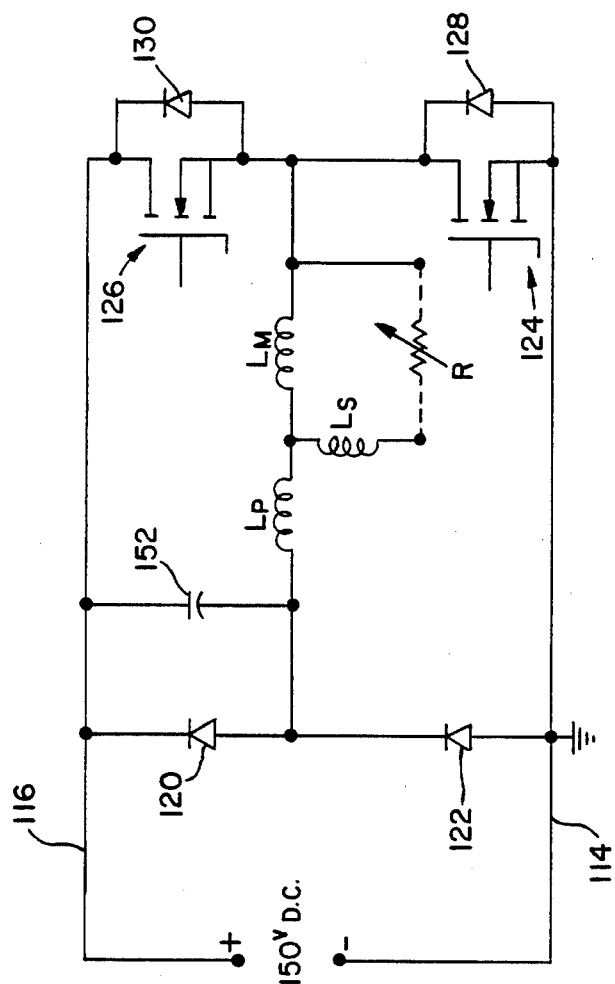
FIG. 2 is a schematic of an equivalent circuit showing selected portions of the voltage converter of FIG. 1.

During the period when voltage converter 100 is operating, the portion of the converter which includes capacitor 152 and transformer 134 can be represented as an equivalent circuit illustrated in FIG. 2. In the equivalent circuit of FIG. 2, other elements of voltage converter 100 are also illustrated to facilitate the description of the function of oscillation damping diodes 120 and 122.

In particular, other than the numbered elements which are common to FIG. 1, inductors $L_P$ and $L_S$ are also illustrated in FIG. 2 and represent very small leakage inductances of primary winding 132 (FIG. 1) and secondary winding 142 (FIG. 1), respectively. Inductor $L_M$ represents the major and significantly larger inductance of transformer 134. Further, variable resistor $R_L$ represents any load which could be connected between output terminals 148 and 150 (FIG. 1).

For purposes of description, assume that diodes 120 and 122 are not connected in voltage converter 100. Assume further that voltage converter 100 is operating in a normal-load mode and that transistor 124 is on. Also, since the inductance value of inductor $L_P$ is so small, it has little or no effect on circuit operation and, therefor, will not be considered or discussed further.

If a short occurs in the load, or in resistor $R_L$, inductors $L_M$ and $L_S$ are in parallel with no effective resistance in the parallel circuit. Under this shorted-load condition, the inductive component of the impedance in the equivalent circuit of FIG. 2 drops drastically to a level smaller than the small value of inductor $L_S$ and appears essentially as a short in the charging path of capacitor 152. Significantly high current then flows in the capacitor-charging direction whereby inductor $L_M$ quickly becomes perpetually saturated and capacitor 152 quickly charges to essentially full supply voltage of 150 volts.

With the effective inductance in the circuit having dropped drastically, the resonant frequency of inductor $L_M$ and capacitor 152 increases significantly to a level higher than the operating frequency of voltage converter 100. Thus, the circuit, which includes the parallel-connected inductors $L_M$ and $L_S$, becomes a low impedance oscillatory path whereby at least several oscillations occur during each period when transistor 124 is on. During successive oscillations, capacitor 152 charges quickly in stepped levels well beyond full power supply voltage to catastrophic levels. Eventually, unless the oscillations are damped, capacitor 152 destructs.

Assume now that diode 122 is connected in voltage converter 100 as illustrated in FIGS. 1 through 6 and 7A. Assume further that voltage converter 100 is operating in a normal-load mode and that transistor 124 is on. If a short occurs in the load, or in resistor $R_L$ of FIG. 2, the current resulting from the collapsing field of inductor $L_M$ is now directed through a loop which includes the drain and source electrodes of transistor 124, diode 122 and inductor $L_M$ instead of step charging capacitor 152 to excessive levels. The resulting current continues in this loop until the field has completely dissipated. During this time, the charge on capacitor 152 remains at the supply voltage level and the oscillations are damped thereby avoiding any catastrophic event during the period when transistor 124 is on.

When transistor 124 is turned off and transistor 126 is turned on, capacitor 152, inductor $L_M$ and the drain and source electrodes of transistor 126 are now in a closed loop. Previously charged capacitor 152 discharges rapidly through the low impedance of inductors $L_M$ and $L_S$ to essentially zero volts whereby a field is developed rapidly about inductor $L_M$. Assuming still that diode 120 is not in the circuit, when capacitor 152 is fully discharged, the field about inductor $L_M$ collapses and charges capacitor 152 in the negative direction. The power supply voltage and the negative charge on capacitor 152 would then be in a cumulative arrangement to provide a total voltage which greatly exceeds the normal supply voltage of 150 volts when transistor 124 is again turned on.

This condition would again lead to the catastrophic event previously described whereby capacitor 152 would destruct.

By connecting diode 120 in voltage converter 100 as illustrated in FIG. 2, the charging of capacitor 152 in the negative direction is precluded. Thus, capacitor 152 has been fully discharged, the current resulting from the collapsing field of inductor $L_M$ flows through diode 120 thereby bypassing the capacitor. Eventually, the field is fully dissipated and a steady state condition exists for the remainder of the period when transistor 126 is on.

Thus, by connecting diodes 120 and 122 in voltage converter 100 as illustrated in FIGS. 1 through 6 and 7A, the converter is provided with a means for preventing undesirable oscillations in the converter when a short occurs in any load which is connected between output terminals 148 and 150.

Figure 3:
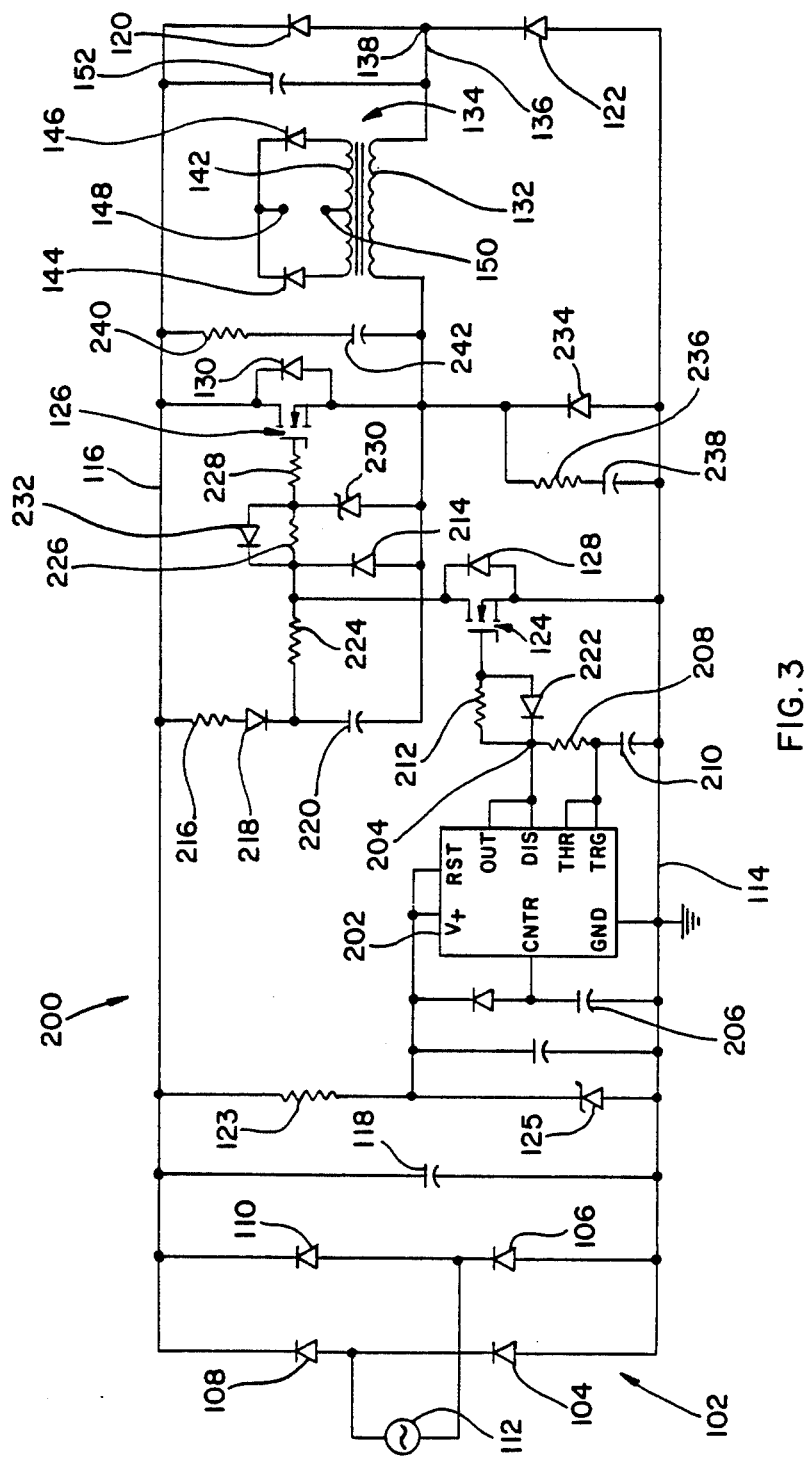
FIGS. 3, 4, 5, 6, 7A and 7B are schematics showing various embodiments of a voltage converter in accordance with certain principles of the invention.

Referring to FIG. 3, in theoretical operation of voltage converter 200, an oscillator 202 operates at a frequency of 25 KHz and produces an alternating voltage in the form of a square wave which appears at a node 204. Oscillator 202 includes a CMOS RC timer which is a self-contained chip of the type identified as an ICM 7555 available from Intersil, Inc. of Cupertino, Calif. During initial operation of voltage converter 200, capacitor 206 provides a soft start for oscillator 202 which permits capacitor 152 to gradually charge from zero volts to the peak level of, for example, 75 volts. An RC network, including resistor 208 and capacitor 210, is connected to oscillator 202 as illustrated in FIG. 3 and establishes the frequency of operation of the oscillator and voltage converter 200.

During the first half cycle of each square wave output of oscillator 202, current flows from the oscillator, through a resistor 212 and through the gate and drain electrodes of transistor 124 whereby the transistor is biased on. When transistor 124 is turned on, the gate of transistor 126 is effectively grounded through the source and drain electrodes of transistor 124 and is thereby turned off. During the period when transistor 124 is conducting, current flows through capacitor 152 in the first or charging direction, through primary winding 132, diode 214 and the source and drain electrodes of transistor 124. During this period, capacitor 152 is charged to a predetermined level, for example 75 volts, based on selected circuit parameters. Further, during this period, current flows through a resistor 216, a diode 218, a capacitor 220, diode 214 and the source and drain electrodes of transistor 124 whereby the capacitor is charged essentially to the voltage level appearing between lines 114 and 116.

During a second half cycle of each square wave output of oscillator 202, transistor 124 is biased off. In addition, capacitor 220 ceases to charge through transistor 124 whereby the gate of the transistor quickly discharges through a diode 222 into oscillator 202. Capacitor 220 then begins to discharge through a closed loop which includes three resistors 224, 226 and 228 and the gate and source electrodes of transistor 126 whereby the transistor is biased on.

Thus, capacitor 220 functions as a tertiary power source in voltage converter 200 to provide the power to turn on transistor 126. With respect to the charging of capacitor 220, transistor 124 and the components in the charging path of the capacitor function as a means for facilitating the development of the voltage of the tertiary power source. Further, the shut down of transistor 124 in combination with the three resistors 224, 226 and 228 form a means for applying the voltage of the tertiary power source, i.e. capacitor 220, to turn on transistor 126.

When transistor 126 is turned on, the source and drain electrodes of the transistor are now in a series loop with capacitor 152 and primary winding 132 whereby the capacitor discharges within the loop to supply current in the second or discharging direction through the primary winding. Zener diode 230 is designed to clamp the gate voltage at the saturation voltage level of transistor 126 and thereby prevents any potentially harmful application of voltage to the transistor above the operating voltage level. On the next successive half-cycle, transistor 124 is biased on and transistor 126 is biased off whereby the gate capacitance of transistor 126 discharges quickly through a loop which includes a diode 232, the source and drain electrodes of transistor 124, a diode 234 and resistor 228.

During the alternate operation of transistors 124 and 126, current flows through primary winding 132 in alternate directions during successive half cycles of the square wave output of oscillator 202 at the frequency of 25 KHz. This results in the developing of an induced voltage in secondary winding 142 the level of which is stepped down from the level of voltage appearing across the primary winding. The induced voltage is then rectified by either diode 144 or diode 146 to provide a low level D.C. voltage appearing at output terminals 148 and 150 in the same manner as provided by voltage converter 100. Also, in voltage converter 200, A.C. source 112 and rectifier 102 function as a primary power source, capacitor 152 functions as a secondary power source and, as noted above, capacitor 220 functions as a tertiary power source. Further, the operation of transistor 124 in conjunction with the circuit for charging capacitor 220 provides a means for establishing the voltage of the tertiary power source.

A resistor 236 and a capacitor 238 are connected in parallel with the source and drain electrodes of transistor 124 and function as a snubber circuit to provide a bypass around the transistor for any spurious voltage spikes which may occur and which could possibly damage the transistor. Similarly, a resistor 240 and a capacitor 242 are connected in parallel with the source and drain electrodes of transistor 126 and function as a snubber circuit for the transistor.

Figure 4:
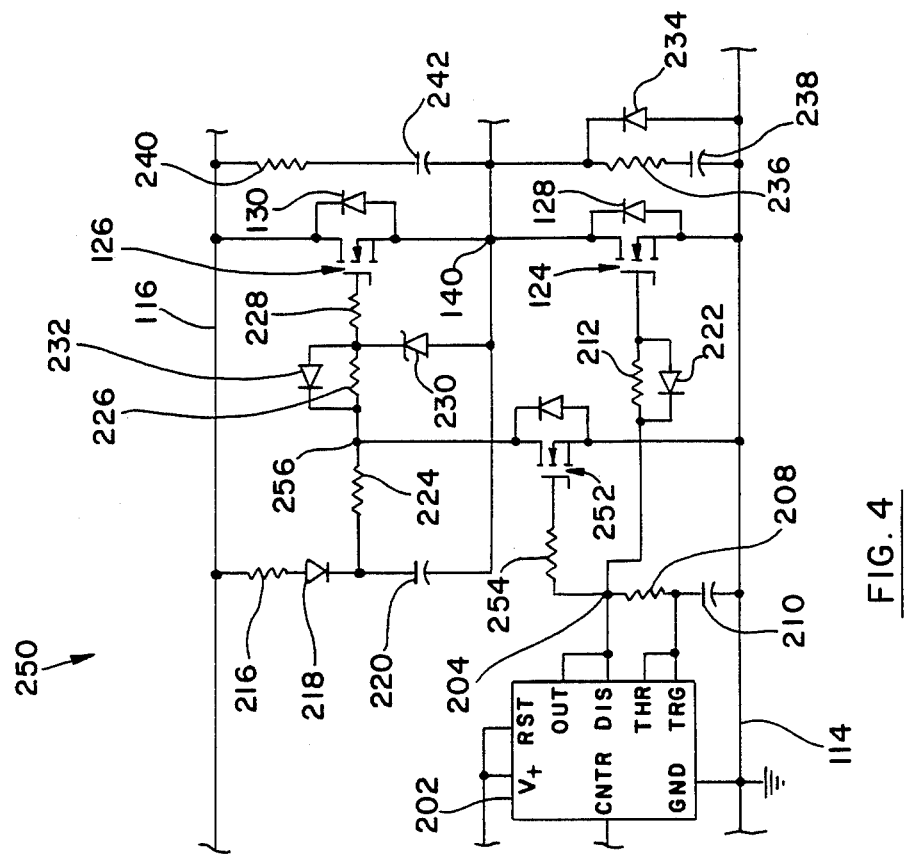

Referring now to FIG. 4, there is a partial illustration of voltage converter 250 which is a variation of voltage converter 200 (FIG. 3). Those portions of converter 250 which are not illustrated are identical to corresponding portions of converter 200. In converter 250, diodes 214 and 234 have been removed. Also, transistor 124 has been connected so that the source and drain electrodes thereof are connected between node 140 and line 114 in the same manner as illustrated in FIG. 1. Also, the gate of a third N-channel power MOSFET transistor 252 is connected through a resistor 254 to node 204. The source and drain electrodes of transistor 252 are connected between a node 256 and line 114.

Voltage converter 250 operates in somewhat the same manner as converter 200 (FIG. 3) except that when transistor 124 is biased into conduction, transistor 252 is also biased into conduction. In this manner, transistor 126 is biased off by virtue of the gate thereof being grounded through the source and drain electrodes of transistor 252. Transistor 124 functions as described with respect to converter 200 but without the necessity for diodes 214 (FIG. 3) and 234. Further, capacitor 220 charges through the source and drain electrodes of transistor 124. When transistors 124 and 252 are biased off through control of the output of oscillator 202, capacitor 220 begins to discharge as previously described to turn on transistor 126.

As shown in FIG. 5, sensing and control circuit 154 of voltage converter 300 includes a voltage divider network which is formed by a resistor 302 and a rheostat 304 connected in series between lines 114 and 136. The resistance values of resistor 302 and rheostat 304 are high, for example 75K ohms and 50K ohms, respectively, and develop voltage levels in response to the ripple voltage of capacitor 152.

Thus, resistor 302 and rheostat 304 form a means for sensing the voltage swing of capacitor 152.

The voltage developed across rheostat 304 is representative at any instant of the voltage of capacitor 152 and is applied through a tap line 306 to the TRIGGER input of a CMOS RC timer which is connected to function as a one-shot multivibrator 308. The CMOS RC timer is a self-contained chip of the type identified as an ICM 7555 available from Intersil, Inc. of Cupertino, Calif.

Zener diode 125 is connected to facilitate the application of operating voltage to multivibrator 308 while the OUTPUT terminal is connected to a base 310 of a bipolar transistor 312. A resistor 314 and a capacitor 316 are connected in series between the OUTPUT of multivibrator 308 and line 114 while the THRESHOLD and DISCHARGE terminals of the multivabrator are connected to a juncture between the resistor and the capacitor.

The RESET and CONTROL VOLTAGE terminals of oscillator 202 are connected to collector 318 of transistor 312 and to line 114 through soft-start capacitor 206. Emitter 320 of transistor 312 is also connected to line 114.

In normal operation, voltage converter 300 is operating properly and there is either no load, or a desired or normal load, connected to output terminals 148 and 150. In either event, the voltage appearing normally across rheostat 304 is greater than one-third the value of the voltage applied to multivibrator 308 between the V+ and GROUND terminals. Under this condition, multivibrator 308 operates in a mode whereby the OUTPUT of the multivibrator is consistently low. This maintains transistor 312 in the nonconductive state. When transistor 312 is not conducting, the RESET terminal of oscillator 202 is high and the oscillator operates constantly at a predetermined periodicity or frequency, for example, of 25 KHz. Thus, transistors 124 and 126 are controlled to be alternately switched, and thereby operate, at the predetermined frequency of 25 KHz to control current flow through primary winding 132, as described above, and thereby establish the low level D.C. voltage across output terminals 148 and 150.

Assume that an overload condition such as a short occurs between output terminals 148 and 150 which causes the previously-noted wide amplitude swings of the voltage of capacitor 152. When this occurs, capacitor 152 charges significantly to a higher-than-normal average voltage level whereby the voltage across rheostat 304 drops below the trigger voltage level of multivibrator 308. Thus, the voltage appearing across rheostat 304 is thereby altered to the extent that the operation of multivibrator 308 is altered whereby the OUTPUT of the multivibrator goes high. This causes transistor 312 to conduct whereby the RESET and CONTROL VOLTAGE terminals of oscillator 202 go low to turn off the oscillator. With oscillator 202 turned off, there is no alternating square-wave voltage appearing at node 204 to alternately switch the operation of transistors 124 and 126 and both transistors effectively shut down.

In this manner, multivibrator 308 and transistor 312 form a means for controlling the operation of oscillator 202. In particular, multivibrator 308 and transistor 312 provide a means, which is responsive to a significant increase in the average voltage level of capacitor 152 resulting from wide swings in the capacitor voltage, for shutting down oscillator 202 and transistors 124 and 126.

In a broader sense, circuit 154 forms a means for sensing voltage swings in the voltage of capacitor 152 and for preventing the operation of either of the transistors 124 or 126 but does not remove power from the other portions of voltage converter 300.

In normal operation, oscillator 202 develops a square wave output at 25 KHz. When the output of oscillator 202 is shut down, for example when an overload occurs across output terminals 148 and 150, the square wave output ceases. After a long interval, for example one second, multivibrator 308 operates through an internal timing system within the multivibrator for forty microseconds whereby the OUTPUT of the multivibrator goes low and oscillator 202 again produces the square wave output. If the overload condition is still present, the OUTPUT of multivibrator 308 again goes high resulting in the shut down of oscillator 202. This pattern continues until either the overload condition is corrected or voltage converter 300 is disconnected from A.C. source 112. It is noted that the internal timing system mentioned above is inherent to an ICM 7555 when it is wired as illustrated in FIG. 5 to function as a multivibrator. Thus, in this instance, multivibrator 308 functions as a means for periodically examining the load after shutdown of transistors 124 and 126 to determine whether the overload condition persists.

As illustrated in FIG. 6, voltage converter 400 differs from voltage converter 200 (FIG. 3) in the manner in which transistor 126 is controlled to switch on and off in response to the square wave output of oscillator 202.

When the output of oscillator 202 is high, a N channel power MOSFET transistor 402 is turned on and, through the drain and source electrodes of the transistor, connects ground reference line 114 to the gate electrode of a N channel power MOSFET transistor 404. This insures that transistor 404 will not turn on and that transistor 126 will not turn on when transistor 124 is on. Also when transistor 124 is turned on, a charging path is formed which includes a diode 406, a capacitor 408 and the source and drain electrodes of the transistor to thereby charge the capacitor essentially to the voltage level appearing between lines 114 and 116.

When the output of oscillator 202 goes low, transistors 124 and 402 are turned off whereby ground reference line 114 is disconnected from the gate electrode of transistor 404. Also, the charging path for capacitor 408 is now open and the capacitor is precluded from discharging through the charging path by the inverse connection of diode 406. At this time, capacitor 408 begins to discharge slowly through a path which includes gating resistors 410 and 412, and the gate and source electrodes of transistor 404. The resultant current flow through the gate-source circuit of transistor 404 causes the transistor to turn on. Capacitor 408 then begins to discharge more rapidly through a path which includes a parallel combination of a capacitor 414 and a resistor 416, the source and drain electrodes of transistor 408, a pair of current limiting resistors 418 and 420 and the gate and source electrodes of transistor 126.

Capacitor 414 is a very low-valued capacitor while resistor 416 is of a relatively high resistance value. This permits rapid current flow initially through capacitor 414 until the low-valued capacitor is nearly fully charged whereafter current flows more slowly through resistor 416. The initial rapid current flow through the discharge path of capacitor 408, which includes capacitor 414 and transistor 126, causes the transistor to turn on rapidly. A Zener diode 422 is designed to breakdown at the operating voltage level of transistor 126 and thereby prevents any potentially harmful application of voltage to the transistor above the operating voltage level.

Thus, capacitor 408 functions as a tertiary power source of voltage converter 400 and powers the operation of transistor 126. With respect to the charging of capacitor 408, transistors 124 and 402 and the components in the charging path of the capacitor function as a means for facilitating the development of the voltage of the tertiary power source. Further, the shut down of transistor 402, the turn on of transistor 404 and all of the components associated with the discharge of capacitor 408 form a means for applying the voltage of the tertiary power source, i.e. capacitor 408, to turn on transistor 126.

Transistor 126 will remain on until transistor 402 is again turned on and the ground reference line 114 is connected thereby to the gate electrode of transistor 404. At this time, capacitor 408 begins to charge as described above and transistor 126 begins to discharge. The discharge path for transistor 126 includes resistors 418 and 420, a Zener diode 424 and the source and drain electrodes of now-conducting transistors 124 and 402. Diode 424 insures that the discharging current of transistor 126 will not flow through the gate-source circuit of transistor 404 and thereby prevents potential damage to transistor 404.

Transistors 402 and 404, along with the other elements in the biasing control circuit for transistor 126, form a power buffer 426. Thus, while the bias control for the operation of transistor 124 is derived directly through oscillator 202, the bias control for the operation of transistor 126 is derived indirectly through oscillator 202 and directly through power buffer 426 which includes a tertiary or separate power source, namely charged capacitor 408.

Voltage converter 500 is illustrated collectively in FIGS. 7A and 7B. As previously described, sensing and control circuit 154 senses swings in the voltage of capacitor 152 and controls the on-off operation of oscillator 202 in response thereto. In turn, this determines whether transistors 124 and 126 operate in the alternately switched mode or whether the transistors are shut down completely.

In the operation of power buffer 426 to bias and control the operation of transistor 126 as previously described, transistor 402 is biased to operate simultaneously with transistor 124. In this manner, transistor 404 is biased off during operation of transistor 124 and the voltage of the tertiary power supply, i.e., capacitor 408, is not applied to transistor 126 whereby transistor 126 is biased off. Therefore, transistor 402 must be conducting in order to maintain transistor 126 in the "off" mode.

When an overload occurs in the load connected between output terminals 148 and 150, large swings occur in the voltage of capacitor 152 whereby rheostat 304 senses such swings and biases multivibrator 308 to provide a high OUTPUT which results in the biasing of transistor 312 to shut down oscillator 202. If power buffer 426 is connected as illustrated in FIG. 6, the shutting down of oscillator 202 would result in the shutting down of transistor 402 whereby transistor 126 would then be turned on. Since the purpose of multivibrator 308 and transistor 312 is to shut down both transistors 124 and 126 in response to wide voltage swings of capacitor 152, the manner of circuit connection of FIG. 6 would not accomplish this purpose.

Therefore, as illustrated in FIGS. 7A and 7B, the OUTPUT of multivibrator 308 is connected through a diode 502 (FIG. 7B) to the gate electrode of transistor 402. Also, the OUTPUT of oscillator 202 is connected through a diode 504 (FIG. 7B) to the gate electrode of transistor 402. Otherwise, transistor 124 is connected to oscillator 202 in the same manner illustrated in FIG. 5 and power buffer 426 is connected to transistor 126 as illustrated in FIG. 6.

During operation of voltage converter 500 in a no-load mode or a normal-load mode, when oscillator 202 biases transistor 124 on, transistor 402 is biased on by the OUTPUT of the oscillator through diode 504. Therefore, voltage converter 500 operates in the same manner as voltage converter 400 during the no-load mode or the normal-load mode. However, if an overload occurs, multivibrator 308 is biased to go high at the OUTPUT in order to shut down oscillator 202. The high OUTPUT of multivibrator 308 also is coupled through diode 502 to the gate electrode of transistor 402 to insure that the transistor remains on when oscillator 202 is shut down and thereby insures that transistor 126 remains shut down. In this manner, transistor 402 is biasingly controlled by oscillator 202 during a no-load mode or a normal-load mode and is controlled by multivibrator 308 during an overload mode.

As described above, voltage converters 100, 200, 250, 300, 400 and 500 provide a variety of embodiments which convert high A.C. voltage, or high D.C. voltage, to a low level D.C. voltage. These various embodiments employ the basic concept of applying a voltage during alternate periods to high frequency step-down transformer 134 and rectifying the transformer output to obtain the low level D.C. voltage. In each embodiment, capacitor 152 functions as a power source during one of the alternate periods to apply voltage to transformer 134.

Additionally, each of the voltage converters 100, 200, 250, 300, 400 and 500 employs techniques for protecting the converter when an overload condition occurs. In one such technique, voltage conditions are constantly monitored during circuit operation to determine when an overload occurs and to shut down the converter operation. In another technique, the circuit is monitored during operation and if excessive current flow develops the current is shunted to avoid destruction to components of the converter. In converters 300 and 500, both of the converter protection techniques are employed.

By use of power field effect transistors, voltage converters 100, 200, 250, 300, 400 and 500 operate at high speeds and at high efficiency. Also, comparatively fewer components are required which provides an economic advantage. Significantly, each of the voltage converters 100, 200, 250, 300, 400 and 500 provide simple and effective facility for protecting the converter in the event of an overload.

It is to be understood that, while converters 100, 200, 250, 300, 400 and 500 are referred to herein as voltage converters, these converters could be referred to, for example, as power converters or any other comparable expression without departing from the spirit and scope of the invention.

It is to be further understood that the above-described embodiments of voltage converters 100, 200, 250, 300, 400 and 500 are simply illustrative of this invention. Other embodiments may be devised by those skilled in the art which will embody the principles of the invention and fall within the spirit and scope thereof.

Figure 8:
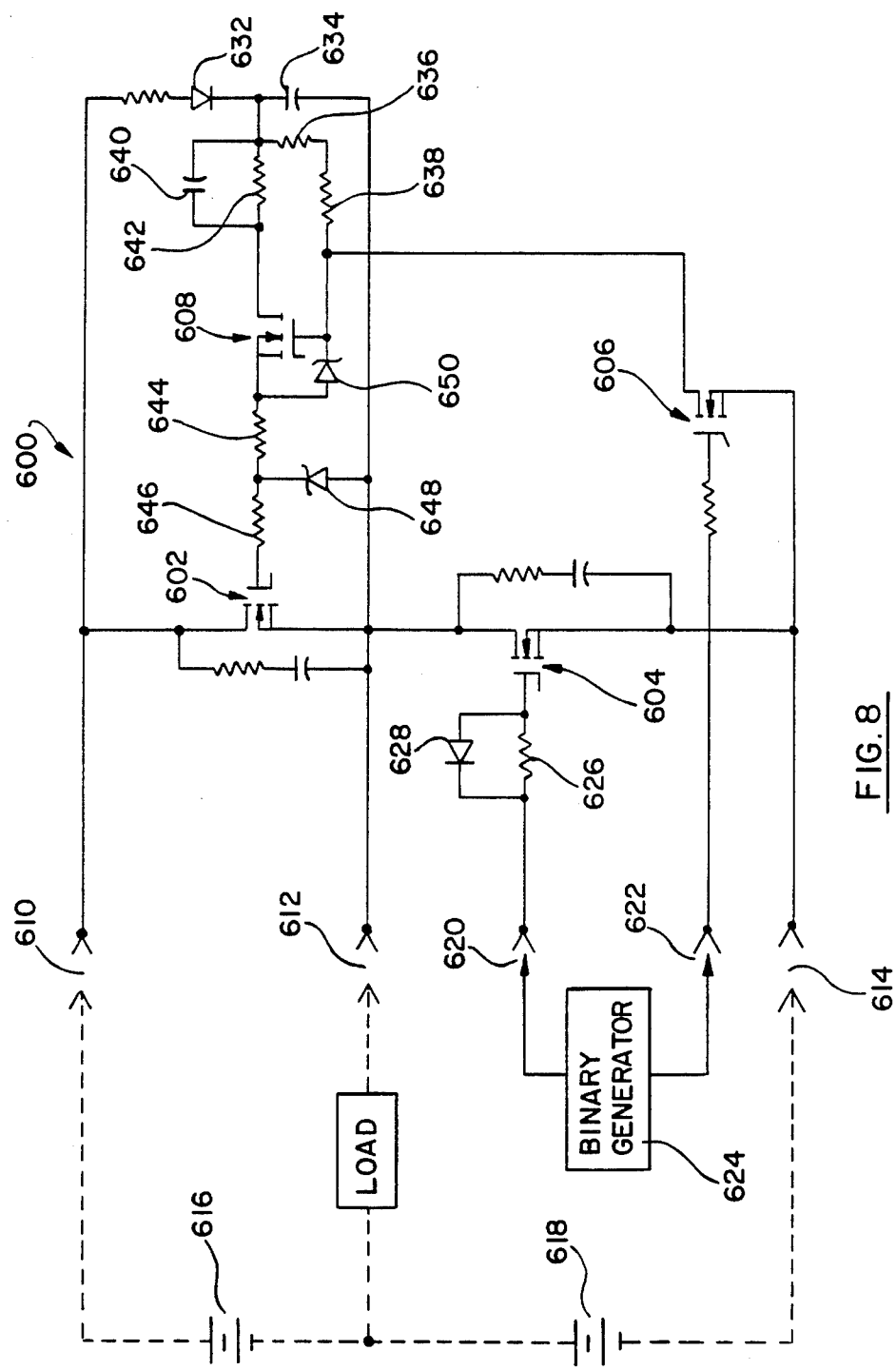
FIG. 8 is a schematic showing a power buffer of the type used with the embodiments of the voltage converter of FIGS. 6 and 7B and further illustrating certain principles of the invention.

Referring now to FIG. 8, there is illustrated a half-wave inverter or power buffer 600 of the type used in voltage converters 400 and 500. Power buffers, such as buffer 600, are typically used for converting DC power to AC power at a desired or prescribed output voltage and frequency. Buffers of this type are also typically used as power supplies for a variety of systems, as variable-speed AC motor drives, for induction heating systems and as an output of DC transmission lines.

In one type of power buffer, such as that described in U.S. Pat. No. 4,316,243, a pair of power field effect transistors are alternately switched to facilitate the supply of current to a load in opposite directions from two alternate DC sources such as alternate batteries. The on-off operation of a first of the power transistors is controlled through a first switching bipolar transistor by the application of a square wave pulse to the switching transistor. A second of the power transistors is powered by the voltage of a capacitor which is charged from a battery independent of the two alternate batteries of the power buffer. A second switching bipolar transistor is also responsive to the square wave pulse to control the operation of a third switching bipolar transistor which facilitates application of the capacitor voltage to the second power transistor.

The buffer of U.S. Pat. No. 4,316,243 requires two power field effect transistors, three bipolar N-P-N transistors and a third battery to charge the capacitor for operating one of the power transistors.

Power buffer 600 includes four N channel MOSFET power transistors 602, 604, 606 and 608. Power buffer 600 further includes power output terminals 610, 612 and 614. The positive side of a first DC supply battery 616 is connected through terminal 610 to the drain electrode of transistor 602. The negative side of a second DC supply battery 618 is connected through terminal 614 to the source electrode of transistor 604. The other side of each of the batteries 616 and 618 is connected to one side of a load, the other side of which is connected to terminal 612.

Power buffer 600 further includes a pair of input terminals 620 and 622 which provide binary signal inputs to the buffer to control the operation thereof. As illustrated in FIG. 8, a binary generator 624 is coupled to power buffer 600 through input terminals 620 and 622 to control the operation of transistor 602 and 604.

Assume initially that through control of binary generator 624, the input terminals 620 and 622 are both high. The gate electrode of transistor 604 is connected to terminal 620 through a low-valued resistor 626. A reverse biased diode 628 is connected in parallel with resistor 626. When terminal 620 goes high, as noted above, transistor 604 begins to charge at a rapid rate determined by the value of resistor 626 and the capacitance of the transistor. Thus, transistor 604 becomes charged rapidly and is turned on quickly.

When transistor 604 is turned on, a charging path is formed which includes a diode 632, a capacitor 634 and the source and drain electrodes of the transistor to thereby charge the capacitor essentially to the cumulative voltage level of batteries 616 and 618. Also, when transistor 604 is on, the load is connected in a series circuit which includes battery 618 and the source and drain electrodes of the transistor whereby current is supplied to the load in a first direction.

When terminal 622 is high, as noted above, transistor 606 is turned on. Through the drain and source electrodes of transistor 606, the negative side of battery 618 is connected to the gate electrode of transistor 608 to prevent transistor 608 from turning on. This insures that transistor 602 will not turn on at this time.

Assume now that through control of binary generator 624, terminals 620 and 622 go low whereby transistors 604 and 606 are turned off. When transistor 606 is turned off, the gate electrode of transistor 608 is disconnected from the negative side of battery 618. Also, the charging path for capacitor 634 is now open and the capacitor is precluded from discharging through the charging path by the inverse connection of diode 632.

At this time, capacitor 634 begins to discharge slowly through a path which includes gating resistors 636 and 638, and the gate and source electrodes of transistor 608. The resultant current flow through the gate-source circuit of transistor 608 causes the transistor to turn on. Capacitor 634 then begins to discharge more rapidly through a path which includes a parallel combination of a capacitor 640 and a resistor 642, the source and drain electrodes of transistor 608, a pair of current limiting resistors 644 and 646 and the gate and source electrodes of transistor 602.

Capacitor 640 is a very low-valued capacitor while resistor 642 is of a relatively high resistance value. This permits rapid current flow initially through capacitor 640 until the low-valued capacitor is nearly fully charged whereafter current flows more slowly through resistor 642. The initial rapid current flow through the discharge path of capacitor 634, which includes capacitor 640 and transistor 602, causes the transistor to turn on rapidly. A Zener diode 648 is designed to breakdown at the operating voltage level of transistor 602 and thereby prevents any potentially harmful application of voltage to the transistor above the operating voltage level.

During the period when transistor 602 is on, battery 616 is connected across the load which results in current flowing through the load in a second direction which is opposite from the first-direction current. This results in the establishment of an alternating current through the load during the periods when transistors 602 and 604 are alternately switched.

Transistor 602 will remain on until transistor 606 is again turned on and the negative side of battery 618 is connected to the gate electrode of transistor 608. At this time, capacitor 634 begins to charge as described above and transistor 602 begins to discharge. The discharge path for transistor 602 includes resistors 644 and 646, a Zener diode 650 and the source and drain electrodes of transistors 604 and 606. Diode 650 insures that the discharging current of transistor 602 will not flow through the gate-source circuit of transistor 608 and thereby prevents potential damage to transistor 608.

In the above-described example, terminals 620 and 622 were either both high or both low to provide an alternating current through the load. This was accomplished by alternately switching power transistors 602 and 604 by control of the binary inputs to power buffer 600.

If it is desired to preclude the application of any voltage to the load, the binary generator 624 can be controlled so that terminal 620 is low and terminal 622 is high. In this manner, both transistors 602 and 604 will be shut down.

It is important to note that a condition cannot occur where both transistors 602 and 604 are on simultaneously which would cause a short circuit across batteries 616 and 618. If transistor 604 is conducting and the gate of transistor 602 is biased on due to spurious noise in the electrical systems, the gate charge will dissipate through transistor 606 thereby forcing transistor 602 to turn off. Also, this eliminates a need for special logic to produce a delay between turn on and turn off of transistors 602 and 604.

Power buffer 600 provides a circuit which is simple and which utilizes only fast-acting voltage-sensitive power transistors. Further, in power buffer 600, the voltage of supply batteries 616 and 618 establishes another DC supply voltage source by charging capacitor 634. The established DC supply voltage source of capacitor 640 then, upon demand, provides the necessary voltage to turn on transistor 602 as described. Consequently, there is no need for an additional battery to charge capacitor 634.

It is to be understood that the above-described embodiment of power buffer 600 is simply illustrative of this invention. Other embodiments may be devised by those skilled in the art which will embody the principles of the invention and fall within the spirit and scope thereof.

What is claimed is:

1. A voltage converter, which comprises:
a load circuit;
means for coupling a power source to the voltage converter to provide a primary D.C. power source;
a secondary D.C. power source;
primary coupling means for coupling the primary D.C. power source to the load circuit to apply power of one polarity to the load circuit from the primary D.C. power source during a first portion of each cycle of operation of the voltage converter;
means for operating the primary coupling means during the first portion of each cycle;
secondary coupling means for coupling the secondary D.C. power source to the load circuit independently of the primary D.C. power source to apply power of opposite polarity to the load circuit from the secondary D.C. power source during a second portion of each cycle of operation of the voltage converter;
a tertiary D.C. power source developed through the primary coupling means during the period when the primary D.C. power source is coupled to the load circuit, and means operable independently of the means for operating the primary coupling means for coupling the tertiary D.C. power source to the secondary coupling means during the second portion of each cycle to bias the secondary coupling means and thereby facilitate the application of power of the opposite polarity to the load circuit.

2. A voltage converter, which comprises:
a load circuit;
means for coupling a power source to the voltage converter to provide a primary D.C. power source;
a secondary D.C. power source for providing voltage at a prescribed level;
primary coupling means for coupling the primary D.C. power source to the load circuit to apply voltage of one polarity to the load circuit from the primary D.C. power source during a first portion of each cycle of operation of the voltage converter;
secondary coupling means for coupling the secondary D.C. power source to the load circuit to apply voltage of opposite polarity to the load circuit from the secondary D.C. power source during a second portion of each cycle of operation of the voltage converter, and
means responsive to the voltage of the secondary D.C. power source rising to a predetermined level above the prescribed level for disabling the primary coupling means and the secondary coupling means to preclude application of voltage from the primary and secondary D.C. power sources to the load circuit.

3. A voltage converter, which comprises:
a load circuit;
means for coupling a power source to the voltage converter to provide a primary D.C. power source for supplying current to flow in a first direction in the load circuit;
a secondary D.C. power source for providing voltage at a prescribed level and for supplying current to flow in a second direction in the load circuit;
a switching circuit connectable to the primary D.C. power source, the secondary D.C. power source and the load circuit;
means for controlling the switching circuit to supply current constantly to the load circuit and alternately at a selected and constant periodicity from the primary D.C. power source in the first direction and from the secondary D.C. power source in the second direction, and
means responsive to the voltage of the secondary D.C. power source rising to a predetermined level above the prescribed level for disabling the switching circuit to preclude the application of voltage from the primary and secondary D.C. power sources to the load circuit.

4. A voltage converter, which comprises:
a load circuit;
means for coupling a power source to the voltage converter to provide a primary D.C. power source;
a secondary D.C. power source for providing voltage at a prescribed level;
primary coupling means for coupling the primary D.C. power source to the load circuit to apply voltage of one polarity to the load circuit from the primary D.C. power source during a first portion of each cycle of operation of the voltage converter;
secondary coupling means for coupling the secondary D.C. power source to the load circuit to apply voltage of opposite polarity to the load circuit from the secondary D.C. power source during a second portion of each cycle of operation of the voltage converter;

a tertiary D.C. power source;

means for coupling the tertiary D.C. power source to the secondary coupling means during the second portion of each cycle to bias the secondary coupling means and thereby facilitate the application of voltage of the opposite polarity to the load circuit, and means responsive to the voltage of the secondary D.C. power source rising to a predetermined level above the prescribed level for disabling the primary coupling means and the secondary coupling means to preclude application of voltage from the primary and secondary power sources to the load circuit.

5. A voltage converter, which comprises:

a load circuit;

means for coupling a power source to the voltage converter to provide a primary D.C. power source;

a secondary D.C. power source;

primary coupling means for coupling the primary D.C. power source to the load circuit to apply voltage of one polarity to the load circuit from the primary D.C. power source during a first portion of each cycle of operation of the voltage converter;

secondary coupling means for coupling the secondary D.C. power source to the load circuit to apply voltage of opposite polarity to the load circuit from the secondary D.C. power source during a second portion of each cycle of operation of the voltage converter;

a tertiary D.C. power source developed through the primary coupling means during the period when the primary D.C. power source is coupled to the load circuit;

means for coupling the tertiary D.C. power source to the secondary coupling means during the second portion of each cycle to bias the secondary coupling means and thereby facilitate the application of voltage of the opposite polarity to the load circuit, and means responsive to current flow in the load circuit which is at a level above the prescribed level for shunting such current away from and to preclude any damage to the secondary D.C. power source.

6. A power buffer, which comprises:

a first D.C. power source;

a second D.C. power source;

means responsive to the application of voltage thereto for storing voltage therein;

a first switching device connectable to the first and second D.C. power sources, the voltage storing means and a load;

a second switching device connectable to the second D.C. power source, the voltage storing means and the load;

means for controlling the first switching device:
 (1) to connect the voltage storing means in series with the first and second D.C. power sources during a first period of operation of the power buffer to facilitate the application and storage of voltage at a prescribed level in the voltage storing means, and
 (2) to connect the first D.C. power source to the load during the first period to facilitate the application of voltage of a first polarity to the load, and means for connecting the voltage storage means to the second switching device during a second period of operation of the power buffer to bias the second switching device into operation so that the second D.C. power source is connected to the load to facilitate the application of voltage of an opposite polarity to the load.

7. A voltage converter, which comprises:

a load circuit;

means for coupling a power source to the voltage converter to provide a primary D.C. power source;

a secondary D.C. power source;

primary coupling means for coupling the primary D.C. power source to the load circuit to apply voltage of one polarity to the load circuit from the primary D.C. power source during a first portion of each cycle of operation of the voltage converter;

secondary coupling means for coupling the secondary D.C. power source to the load circuit to apply voltage of opposite polarity to the load circuit from the secondary D.C. power source during a second portion of each cycle of operation of the voltage converter;

a tertiary D.C. power source developed through the primary coupling means during the period when the primary D.C. power source is coupled to the load circuit;

means for coupling the tertiary D.C. power source to the secondary coupling means during the second portion of each cycle to bias the secondary coupling means and thereby facilitate the application of voltage of the opposite polarity to the load circuit;

means responsive to an overload condition in the load circuit for disabling the primary coupling means and the secondary coupling means to preclude application of voltage from the primary and secondary D.C. power sources to the load circuit, and means responsive to current flow in the load circuit which is at a level above the prescribed level for shunting such excessive current away from and to preclude any damage to the secondary D.C. power source.

8. A voltage converter, which comprises:

a load circuit;

means for coupling a power source to the voltage converter to provide a primary D.C. voltage source for applying voltage of one polarity to the load circuit during a first portion of each cycle of operation of the voltage converter;

a secondary D.C. voltage source for applying voltage of opposite polarity to the load circuit during a second portion of each cycle of operation of the voltage converter;

a tertiary D.C. voltage source for facilitating the application of the voltage of the secondary D.C. power source to the load circuit, and means for simultaneously developing the voltage of the secondary and tertiary D.C. voltage sources during the first period of each cycle of operation.

9. A power buffer, which comprises:

a first D.C. power source;

a second D.C. power source;

a third D.C. power source;

first means for connecting the first D.C. power source to a load to supply current through the load in a first direction;

second means for connecting the second D.C. power source to the load to supply current through the load in a second direction;

third means for connecting the first and second D.C. power sources in series with the third D.C. power source to develop and store voltage at a prescribed level in the third D.C. power source;

fourth means for connecting the third D.C. power source to the second means;

means for controlling the first means to connect the first D.C. power source to the load during a first period of operation of the power buffer and for disconnecting the first means during a second period of operation, and means for controlling the fourth means to connect the third D.C. power source to the second means during the second period of operation to operate the second means and thereby facilitate the supply of current from the second D.C. power source to the load in the second direction.

10. A power buffer, which comprises:

a first D.C. voltage source;

a second D.C. voltage source;

a chargeable voltage storage device;

means for applying the cumulative voltage of the first D.C. voltage source and the second D.C. voltage source to the voltage storage device during a first period of operation of the power buffer to charge the device to a prescribed voltage level;

means for applying the voltage of the first D.C. voltage source to a load during the first period to supply current through the load in a first direction, and means responsive to the application thereto of the voltage from the voltage storage device for applying the voltage of the second D.C. voltage source to the load to supply current through the load in a second direction.

11. A voltage converter, which comprises:

a load circuit;

means for coupling a power source to the voltage converter to provide a primary D.C. power source for supplying current to flow in a first direction in the load circuit;

a secondary D.C. power source for supplying current to flow in a second direction in the load circuit independently of the primary D.C. power source;

a switching circuit connectable to the primary D.C. power source, the secondary D.C. power source and the load circuit;

means for controlling the switching circuit to supply current to the load circuit from the primary D.C. power source in the first direction;

a tertiary D.C. power source developed through the switching circuit during the period when the switching circuit is controlled to facilitate the supply of current from the primary D.C. power source in the first direction, and means operable independently of the controlling means for supplying current from the tertiary D.C. power source to the switching circuit to facilitate connection of the secondary D.C. power source to the load circuit and thereby supply current to the load circuit in the second direction;

whereby current is supplied constantly to the load circuit and alternately at a selected and constant periodicity from the primary D.C. power source in the first direction and, independently of the primary D.C. power source, from the secondary D.C. power source in the second direction.

12. A voltage converter as set forth in claim 11, which further comprises:

means for damping any current oscillations which occur in the load circuit at a periodicity greater than the selected periodicity.

13. A voltage converter as set forth in claim 12, wherein the secondary D.C. power source provides a voltage at a prescribed level, and which further comprises:

means responsive to the voltage of the secondary D.C. power source rising to a predetermined level above the prescribed level for disabling the switching circuit to preclude the supply of current from the primary and secondary D.C. power sources to the load circuit.

14. A voltage converter as set forth in claim 13, which further comprises:

means operable after the switching circuit has been disabled for periodically examining the voltage level of the secondary D.C. power source to determine whether the voltage level has dropped below the predetermined level and, in response thereto, for enabling the switching circuit to again alternately supply current to the load circuit at the selected periodicity.

15. A voltage converter, which comprises:

a load circuit;

means for coupling a power source to the voltage converter to provide a primary D.C. power source for supplying current to flow in a first direction in the load circuit;

a charged voltage storage device which forms a secondary D.C. power source for supplying current to flow in a second direction in the load circuit;

a switching circuit connectable to the primary D.C. power source, the secondary D.C. power source and the load circuit;

means for controlling the switching circuit to supply current constantly to the load circuit and alternately at a selected and constant periodicity from the primary D.C. power source in the first direction and from the secondary D.C. power source in the second direction;

a charged voltage storage device which forms a tertiary D.C. power source;

means for supplying current from the tertiary D.C. power source to the switching circuit to facilitate connection of the secondary D.C. power source to the load circuit, and means for simultaneously charging the secondary D.C. power source and the tertiary power source to prescribed voltage levels.

16. The voltage converter as set forth in claim 15 wherein the charging means charges the secondary D.C. power source and the tertiary D.C. power source during a period when current is flowing in the first direction in the load circuit.

17. A voltage converter, which comprises:

a load circuit;

means for coupling a power source to the voltage converter to provide a first D.C. power source for supplying current to the load circuit in a first direction;

a second D.C. power source for supplying current to the load circuit in a second direction independently of the first D.C. power source;

a first switching device for coupling the first D.C. power source to the load circuit;

a second switching device for coupling the second D.C. power source to the load circuit;

a third D.C. power source for supplying current to operate the second switching device;

means for operating the first switching device only during a first-half cycle of each cycle of operation at a prescribed frequency to supply current to the load circuit in the first direction;

means for developing the voltage of the third D.C. power source during the first-half cycle of each cycle of operation when the first switching device is in operation and current is being supplied to the load circuit in the first direction; and means for supplying current from the third D.C. power source to the second switching device only during a second-half cycle of each cycle of operation to operate the second switching device and thereby facilitate the supply of current to the load circuit in the second direction.

18. The voltage converter as set forth in claim 17, which further comprises:

means for charging the second D.C. power source and the third D.C. power source to prescribed levels from the first D.C. power source during the first-half cycle of each cycle of operation.

19. A voltage converter operable at a selected frequency, which comprises:

a load circuit;

means for coupling a power source to the voltage converter to provide a D.C. power source;

a first chargeable voltage storage device;

a second chargeable voltage storage device;

a first switching device connectable to the D.C. power source, the load circuit, the first voltage storage device and the second voltage storage device;

a second switching device connectable to the load circuit, the first storage device and the second storage device;

means for operating the first switching means during a first half of each cycle of the selected frequency to supply current from the D.C. power source to the load circuit in a first direction and to charge the first and second voltage storage devices from the D.C. power source, and means for connecting the second voltage storage device to the second switching device to bias the second switching device into operation during a second half of each cycle of the selected frequency whereby current is supplied from the first voltage storage device to the load circuit in a second direction.

20. The voltage converter as set forth in claim 19, which further comprises:

means for shunting away from the first voltage storage device any current above a predetermined level which is supplied from the load circuit.

21. The voltage converter as set forth in claim 20, wherein the shunting means includes:

a first diode connectable in a closed series loop which includes the load circuit and the first switching device during any period when the first switching device is operable, and a second diode which is connectable in closed loop in series with the load circuit and the second switching device and in parallel with the first voltage storage device during any period when the second switching device is operable.

22. The voltage converter as set forth in claim 19, which further comprises:

means responsive to the first voltage storage device being charged to a voltage level above a predetermined level for disabling the operating means and the connecting means whereby the first and second switching devices are disabled.

23. The voltage converter as set forth in claim 22, which further comprises:

means responsive to and operable after the disabling of the operating means and the connecting means for periodically examining the voltage level of the first voltage storage device to determine whether the voltage level has dropped below the predetermined level and, in response thereto, for enabling the operating means and the connecting means to facilitate the alternately directed supply of current to the load circuit.

24. The voltage converter as set forth in claim 23 wherein the disabling means and the examining and enabling means includes:

a voltage dropping network connected to the first voltage storage device for establishing a voltage representative of the instantaneous voltage level of the first voltage storage device;

a multivibrator for controlling operation of the operating means and the connecting means, and means for coupling the established voltage of the voltage dropping network to the multivibrator to enable or disable the operating means and the connecting means accordingly.

25. The voltage converter as set forth in claim 19, wherein the operating means and the connecting means together include an oscillator which operates at the selected frequency and which on alternate half cycles of operation facilitates the alternate operation of the first and second switching devices.

26. The voltage converter as set forth in claim 19, wherein the connecting means includes a resistive network connected in a loop which includes enabling elements of the second switching device and further includes the second voltage storage device to establish a bias for operating the second switching device.

27. The voltage converter as set forth in claim 19, wherein the connecting means includes:

a third switching device connected to the second voltage storage device and to the second switching device;

means for conducting current from the second voltage storage device to the third switching device to operate the third switching device, and means for conducting current from the second voltage storage device initially rapidly through the third switching device to operate the second switching device and thereafter for conducting the current at a slower rate.

28. The voltage converter as set forth in claim 19 wherein the connecting means includes:

a third switching device connected to the second voltage storage device to facilitate the supply of current from the second voltage storage device to bias the third switching device into operation;

the third switching device further connected to supply current from the second voltage storage device to bias the second switching device into operation;

a fourth switching device connected to the third switching device to maintain the third switching device inoperative, and means for controlling the operation of the fourth switching device (1) to maintain the third switching device inoperative during the first half cycle of each cycle of operation and (2) to facilitate the operation of the third switching device during the second half cycle of each cycle, whereby the second switching device is inoperative during the first cycle and operational during the second cycle.

29. The voltage converter as set forth in claim 28, which further comprises:

means responsive to the first voltage storage device being charged to a voltage level above a predetermined level for biasing the fourth switching device to operate and thereby maintain the second switching device inoperative.

30. The voltage converter as set forth in claim 28, wherein the switching devices are N channel power MOSFET transistors.

31. The voltage converter as set forth in claim 19, wherein the power source which is coupled to the voltage converter is an external A.C. power source, and wherein the voltage converter further comprises a rectifier connected to the coupling means for rectifying the output of the A.C. power source to provide the D.C. power source.

32. A voltage converter, which comprises:

an inductive element;

a first capacitor connected in series with the inductive element;

means for coupling an external power source to the voltage converter to provide a D.C. power source;

a first switching device for connecting the D.C. power source to the series-connected inductive element and the capacitor;

a second switching device for connecting the series-connected inductive element and the capacitor in a closed loop;

a second capacitor connectable to the second switching device;

an oscillator operating at a selected frequency for operating the first switching device during a first half of each cycle of the selected operating frequency:

(1) to connect the D.C. power source to the first capacitor and the inductive device to charge the capacitor and to supply current in a first direction through the inductive element, and (2) to connect the second capacitor to the D.C power source to charge the capacitor, and the oscillator facilitating the connection of the second capacitor to the second switching device during the second half of each cycle whereby the charged voltage supply of the second capacitor biases the second switching device into operation to connect the first capacitor in the closed loop so that the charged first capacitor supplies current in an opposite direction through the inductor.

33. The voltage converter as set forth in claim 32, which further comprises:

means for establishing the on-off operation of the oscillator, and means responsive to the voltage level of the charged first capacitor for controlling the establishing means to turn on the oscillator when the voltage level is below a preselected level and to turn off the oscillator when the voltage level is above the preselected level.

34. The voltage converter as set forth in claim 33, wherein the establishing means is a multivibrator and the controlling means is a voltage dropping network in series with the first capacitor having a precisely located tap coupled to a trigger input of the multivibrator.

35. The voltage converter as set forth in claim 32, which further comprises:

means responsive to resultant current from the inductive device being above a prescribed level for shunting the resultant current away from the first capacitor.

36. The voltage converter as set forth in claim 32, which further comprises:

means connected between the second capacitor and the second switching device for controlling the supplying of current from the second capacitor to the second switching device, and means connected between the oscillator and the controlling means for biasing the controlling means to pass current from the second capacitor to the second switching device only during the second half cycle of each cycle.

37. The voltage converter as set forth in claim 36 wherein the controlling means includes a third switching device and the biasing means includes a fourth switching device.

38. The voltage converter as set forth in claim 37 wherein the switching devices are N channel power MOSFET transistors.

39. A power buffer, which comprises:

a first D.C. power source;

a second D.C. power source;

a chargeable voltage storage device;

a first switching device connectable to the first and second D.C. power sources, the voltage storage device and a load;

a second switching device connectable to the second D.C. power source, the voltage storage device and the load;

means for operating the first switching device during a first period of operation of the power buffer to supply current from the first D.C. power source to the load in a first direction and to charge the voltage storage device from the first and second D.C. power sources, and means for connecting the voltage storage device to the second switching device to bias the second switching means into operation during a second period of operation whereby current is supplied from the second D.C. power source to the load in a second direction.

40. The power buffer as set forth in claim 39, wherein the operating means and the connecting means together include a binary generator which controls the power buffer to operate during the first period and second period of operation.

41. The power buffer as set forth in claim 39 wherein the connecting means includes:

a third switching device connected to the voltage storage device and to the second switching device;

means for conducting current from the voltage storage device to the third switching device to operate the third switching device, and means for conducting current from the voltage storage device initially rapidly through the third switching device to operate the second switching device and thereafter for conducting the current at a slower rate.

42. The power buffer as set forth in claim 39, wherein the connecting means includes:

a third switching device connected to the voltage storage device and to the second switching device;

a fourth switching device connected to the third switching device, and means for controlling the operation of the fourth switching device:

(1) to maintain the third switching device inoperative during the first period of operation of the power buffer, and (2) to facilitate operation of the third switching device during the second period of operation of the power buffer so that the second switching device is operated.

43. The power buffer as set forth in claim 42, which further comprises:

means for conducting current from the voltage storage device initially rapidly through the third switching device to operate the second switching device and thereafter for conducting the current at a slower rate.

44. The power buffer as set forth in claim 42, which further comprises:

means for conducting current from the voltage storage device to the third switching device to operate the third switching device.

45. The power buffer as set forth in claim 42, wherein the switching devices are N channel power MOSFET transistors.

* * * * *